United States Patent
Wang et al.

(10) Patent No.: US 11,342,396 B2
(45) Date of Patent: May 24, 2022

(54) ORGANIC LIGHT EMITTING DIODE DISPLAY PANEL, ORGANIC LIGHT EMITTING DIODE COUNTER SUBSTRATE, AND FABRICATING METHOD THEREOF

(71) Applicant: BOE Technology Group Co., Ltd., Beijing (CN)

(72) Inventors: Guoying Wang, Beijing (CN); Zhen Song, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 598 days.

(21) Appl. No.: 16/330,533

(22) PCT Filed: Feb. 9, 2018

(86) PCT No.: PCT/CN2018/075940
§ 371 (c)(1),
(2) Date: Mar. 5, 2019

(87) PCT Pub. No.: WO2019/153226
PCT Pub. Date: Aug. 15, 2019

(65) Prior Publication Data
US 2021/0335942 A1 Oct. 28, 2021

(51) Int. Cl.
*H01L 27/32* (2006.01)
*H01L 51/00* (2006.01)
(Continued)

(52) U.S. Cl.
CPC ........ *H01L 27/3253* (2013.01); *H01L 27/322* (2013.01); *H01L 27/3246* (2013.01);
(Continued)

(58) Field of Classification Search
CPC ......... H01L 27/3253; H01L 2251/5353; H01L 27/3251; H01L 27/3258
See application file for complete search history.

(56) References Cited

U.S. PATENT DOCUMENTS

2008/0143255 A1   6/2008  Lee et al.
2010/0026167 A1*  2/2010  Park .................... H01L 27/3253
                                              313/504
(Continued)

FOREIGN PATENT DOCUMENTS

| KR | 20060066829 A | * | 6/2006 |
| KR | 20070070408 A |   | 7/2007 |
| KR | 20080049277 A |   | 6/2008 |

OTHER PUBLICATIONS

International Search Report & Written Opinion dated Nov. 9, 2018, regarding PCT/CN2018/075940.

*Primary Examiner* — Alia Sabur
(74) *Attorney, Agent, or Firm* — Intellectual Valley Law, P.C.

(57) ABSTRACT

The present application discloses an organic light emitting diode display panel having a plurality of subpixels. The organic light emitting diode display panel includes an array substrate; and a counter substrate facing the array substrate. The counter substrate includes a plurality of organic light emitting diodes. The array substrate includes a first base substrate and a plurality of thin film transistors on the first base substrate for driving light emission of the plurality of organic light emitting diodes in the counter substrate.

12 Claims, 10 Drawing Sheets

(51) Int. Cl.
*H01L 51/52* (2006.01)
*H01L 51/56* (2006.01)

(52) U.S. Cl.
CPC ...... *H01L 27/3258* (2013.01); *H01L 51/0024* (2013.01); *H01L 51/5284* (2013.01); *H01L 51/56* (2013.01); *H01L 2227/323* (2013.01)

(56) References Cited

U.S. PATENT DOCUMENTS

| | | | | |
|---|---|---|---|---|
| 2010/0096655 | A1* | 4/2010 | Lee | H01L 51/0024 257/98 |
| 2013/0306946 | A1 | 11/2013 | Chang et al. | |
| 2015/0325632 | A1* | 11/2015 | Cheng | H01L 27/3248 257/40 |
| 2016/0071914 | A1* | 3/2016 | Lee | H01L 51/5228 257/40 |

* cited by examiner

ORGANIC LIGHT EMITTING DIODE DISPLAY PANEL, ORGANIC LIGHT EMITTING DIODE COUNTER SUBSTRATE, AND FABRICATING METHOD THEREOF

CROSS-REFERENCE TO RELATED APPLICATION

This application is a national stage application under 35 U.S.C. § 371 of International Application No. PCT/CN2018/075940, filed Feb. 9, 2018, the contents of which are incorporated by reference in the entirety.

TECHNICAL FIELD

The present invention relates to display technology, more particularly, to an organic light emitting diode display panel, an organic light emitting diode counter substrate, and a method of fabricating an organic light emitting diode display panel.

BACKGROUND

Organic light emitting diode (OLED) display apparatuses are self-emissive devices. OLED display apparatuses also provide more vivid colors and a larger color gamut as compared to the conventional liquid crystal display (LCD) apparatuses, and do not require backlights. Further. OLED display apparatuses can be made more flexible, thinner, and lighter than a typical LCD.

SUMMARY

In one aspect, the present invention provides an organic light emitting diode display panel having a plurality of subpixels, comprising an array substrate; and a counter substrate facing the array substrate; wherein the counter substrate comprises a plurality of organic light emitting diodes; and the array substrate comprises a first base substrate and a plurality of thin film transistors on the first base substrate for driving light emission of the plurality of organic light emitting diodes in the counter substrate.

Optionally, the counter substrate has a subpixel region and an inter-subpixel region; wherein the counter substrate in the inter-subpixel region comprises a second base substrate; a spacer layer on the second base substrate configured to maintain a spacing between the array substrate and the counter substrate; and a first electrode layer on a side of the spacer layer distal to the second base substrate, and electrically connected to the plurality of the thin film transistors in the array substrate.

Optionally, the first electrode layer is a substantially transparent electrode layer.

Optionally, the army substrate further comprises a second electrode layer on a side of the plurality of the thin film transistors distal to the first base substrate; the second electrode layer comprises a plurality of second electrode blocks, each of which being electrically connected to a drain electrode of one of the plurality of thin film transistors; and the first electrode layer in the counter substrate comprises a plurality of first electrode blocks, each of which being electrically connected to one of the plurality of second electrode blocks in the array substrate.

Optionally, the second electrode layer is a reflective electrode layer, and the plurality of second electrode blocks are a plurality of reflective electrode blocks.

Optionally, the counter substrate in the subpixel region comprises a third electrode layer on the second base substrate; and an organic light emitting layer on a side of the third electrode layer distal to the second base substrate; wherein the first electrode layer is on a side of the organic light emitting layer distal to the third electrode layer; and each of the plurality of first electrode blocks in each of the plurality of subpixels extends from the subpixel region into the inter-subpixel region.

Optionally, an orthographic projection of each of the plurality of second electrode blocks on the first base substrate substantially covers an orthographic projection of the organic light emitting layer in one of the plurality of subpixels on the first base substrate.

Optionally, the spacer layer comprises a plurality of spacer blocks; and each of the plurality of first electrode blocks is on a side of one of the plurality of spacer blocks distal to the second base substrate in the inter-subpixel region.

Optionally, each of the plurality of subpixels comprises at least one of the plurality of the spacer blocks.

Optionally, the counter substrate in the inter-subpixel region further comprises a fourth electrode layer; the fourth electrode layer comprises a plurality of fourth electrode blocks; each of the plurality of fourth electrode blocks is on a side of one of the plurality of spacer blocks proximal to the second base substrate; and each of the plurality of fourth electrode blocks is electrically connected to the third electrode layer.

Optionally, the fourth electrode layer comprises a metallic material.

Optionally, an orthographic projection of each of the plurality of fourth electrode blocks on the second base substrate substantially covers an orthographic projection of one of the plurality of spacer blocks on the second base substrate.

Optionally, the fourth electrode layer is on a side of the third electrode layer distal to the second base substrate.

Optionally, the counter substrate in the inter-subpixel region further comprises an insulating layer between the spacer layer and the fourth electrode layer; and the insulating layer comprises a plurality of insulating blocks, each of which on a side of one of the plurality of fourth electrode blocks distal to the second base substrate.

Optionally, the organic light emitting diode display panel comprises a recess defined by one of the plurality of insulating blocks, one of the plurality of fourth electrode blocks, and the third electrode layer; and an orthographic projection of the one of the plurality of insulating blocks on the second base substrate substantially covers a combination of an orthographic projection of the recess on the second base substrate and an orthographic projection of one of the plurality of fourth electrode blocks adjacent to the recess on the second base substrate.

Optionally, the counter substrate in the inter-subpixel region further comprises an organic light emitting layer between the spacer layer and the first electrode layer; and the organic light emitting layer in each of the plurality of subpixels extends from the subpixel region into the inter-subpixel region.

Optionally, the counter substrate further comprises a black matrix on the second base substrate and in the inter-subpixel region; a color filter on the second base substrate and in the subpixel region; and an overcoat layer on a side of the black matrix and the color filter distal to the second base substrate.

Optionally, the array substrate is absent of a pixel definition layer.

In another aspect, the present invention provides an organic light emitting diode counter substrate having a subpixel region and an inter-subpixel region; wherein the organic light emitting diode counter substrate in the inter-subpixel region comprises a second base substrate; a black matrix on the second base substrate; a spacer layer on a side of the black matrix distal to the second base substrate; and a first electrode layer on a side of the spacer layer distal to the black matrix; wherein the organic light emitting diode counter substrate in the subpixel region comprises a third electrode layer on the second base substrate; an organic light emitting layer on a side of the third electrode layer distal to the second base substrate; and the first electrode layer on a side of the organic light emitting layer distal to the third electrode layer; wherein the first electrode layer comprises a plurality of first electrode blocks; and each of the plurality of first electrode blocks in each of a plurality of subpixels extends from the subpixel region into the inter-subpixel region.

Optionally, the spacer layer comprises a plurality of spacer blocks; and each of the plurality of first electrode blocks is on a side of one of the plurality of spacer blocks distal to the second base substrate in the inter-subpixel region.

Optionally, each of the plurality of subpixels has at least one of the plurality of the spacer blocks.

Optionally, the organic light emitting diode counter substrate in the inter-subpixel region further comprises a fourth electrode layer; the fourth electrode layer comprises a plurality of fourth electrode blocks; each of the plurality of fourth electrode blocks is on a side of one of the plurality of spacer blocks proximal to the second base substrate; and each of the plurality of fourth electrode blocks is electrically connected to the third electrode layer.

Optionally, the organic light emitting diode counter substrate in the inter-subpixel region further comprises an insulating layer between the spacer layer and the fourth electrode layer, the insulating layer comprises a plurality of insulating blocks; and each of the plurality of insulating blocks is on a side of one of the plurality of fourth electrode blocks distal to the second base substrate.

Optionally, the organic light emitting diode counter substrate further comprises a recess defined by one of the plurality of insulating blocks, one of the plurality of fourth electrode blocks, and the third electrode layer, and an orthographic projection of the one of the plurality of insulating blocks on the second base substrate substantially coven a combination of an orthographic projection of the recess on the second base substrate and an orthographic projection of one of the plurality of fourth electrode blocks adjacent to the recess on the second base substrate.

Optionally, the organic light emitting diode counter substrate further comprises a black matrix on the second base substrate and in the inter-subpixel region; a color filter on the second base substrate and in the subpixel region; and an overcoat layer on a side of the black matrix and the color filter distal to the second base substrate.

In another aspect, the present invention provides a method of fabricating an organic light emitting diode display panel having a plurality of subpixels, comprising forming a counter substrate; forming an array substrate; and assembling the counter substrate and the array substrate together; wherein forming the counter substrate comprises forming a plurality of organic light emitting diodes; and forming the array substrate comprises forming a plurality of thin film transistors on a first base substrate for driving light emission of the plurality of organic light emitting diodes in the counter substrate.

Optionally, forming the array substrate further comprises forming a second electrode layer on a side of the plurality of thin film transistors distal to the first base substrate; forming the second electrode layer comprises forming a plurality of second electrode blocks; and each of the plurality of second electrode blocks is formed to be electrically connected to a drain electrode of one of the plurality of thin film transistors.

Optionally, forming the counter substrate further comprises, in the subpixel region: forming a third electrode layer on the second base substrate; forming an organic light emitting layer on a side of the third electrode layer distal to the second base substrate; and forming a first electrode layer on a side of the organic light emitting layer distal to the third electrode layer, wherein forming the first electrode layer comprises forming a plurality of first electrode blocks; and each of the plurality of first electrode blocks in each of the plurality of subpixels is formed to extend from the subpixel region into the inter-subpixel region.

Optionally, forming counter substrate further comprises, in the inter-subpixel region: forming a spacer layer on a second base substrate; and forming a first electrode layer on a side of the spacer layer distal to the second base substrate; wherein forming the first electrode layer comprises forming a plurality of first electrode blocks; forming the second electrode layer comprises forming a plurality of second electrode blocks; and assembling the counter substrate and the array substrate comprises electrically connecting each of the plurality of first electrode blocks to one of the plurality of second electrode blocks in the array substrate.

Optionally, forming the spacer layer comprises forming a plurality of spacer blocks; and each of the plurality of first electrode blocks is formed on a side of one of the plurality of spacer blocks distal to the second base substrate in the inter-subpixel region.

Optionally, forming the counter substrate further comprises forming a fourth electrode layer in the inter-subpixel region; forming the fourth electrode layer comprises forming a plurality of fourth electrode blocks; each of the plurality of fourth electrode blocks is formed on a side of one of the plurality of spacer blocks proximal to the second base substrate; and each of the plurality of fourth electrode blocks is formed to be electrically connected to the third electrode layer.

Optionally, forming the counter substrate further comprises forming an insulating layer in the inter-subpixel region and between the spacer layer and the fourth electrode layer; forming the insulating layer comprises forming a plurality of insulating blocks; and each of the plurality of insulating blocks is formed on a side of one of the plurality of fourth electrode blocks distal to the second base substrate.

Optionally, forming the counter substrate further comprises forming a recess defined by one of the plurality of insulating blocks, one of the plurality of fourth electrode blocks, and the third electrode layer; the recess is formed so that an orthographic projection of the one of the plurality of insulating blocks on the second base substrate substantially covers a combination of an orthographic projection of the recess on the second base substrate and an orthographic projection of one of the plurality of fourth electrode blocks adjacent to the recess on the second base substrate.

Optionally, forming the counter substrate further comprises forming a black matrix on the second base substrate and in the inter-subpixel region; forming a color filter on the second base substrate and in the subpixel region; and forming an overcoat layer on a side of the black matrix and the color filter distal to the second base substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In fabricating a conventional organic light emitting diode display panel, particularly a top emission-type conventional organic light emitting diode display panel, many defects may occur due to various limitations. For example, in the conventional organic light emitting diode display panel, subpixel regions in the array substrate are defined by a pixel definition layer in the array substrate, and subpixel region in the counter substrate are defined by a black matrix in the counter substrate. Thus, the conventional organic light emitting diode display panel can only tolerate a very small alignment error in the process of assembling the array substrate and the counter substrate. In conventional organic light emitting diode display panel, often an auxiliary cathode is formed in the counter substrate, and a spacer layer is formed on the auxiliary cathode. The adhesion between the metallic auxiliary cathode and an overcoat layer of the counter substrate is often problematic, which often results in fall-off of the auxiliary cathode from the overcoat layer. Similarly, the adhesion between the spacer layer and the auxiliary cathode could also be problematic. Peeling of the spacer layer from the counter substrate can lead to defects in display.

Accordingly, the present disclosure provides, inter alia, an organic light emitting diode display panel, an organic light emitting diode counter substrate, and a method of fabricating an organic light emitting diode display panel that substantially obviate one or more of the problems due to limitations and disadvantages of the related art. In one aspect, the present disclosure provides an organic light emitting diode display panel having a plurality of subpixels. In some embodiments, the organic light emitting diode display panel includes an array substrate and a counter substrate facing the array substrate. The counter substrate includes a plurality of organic light emitting diodes. The array substrate includes a first base substrate and a plurality of thin film transistors on the first base substrate for driving light emission of the plurality of organic light emitting diodes in the counter substrate.

Figure 1:
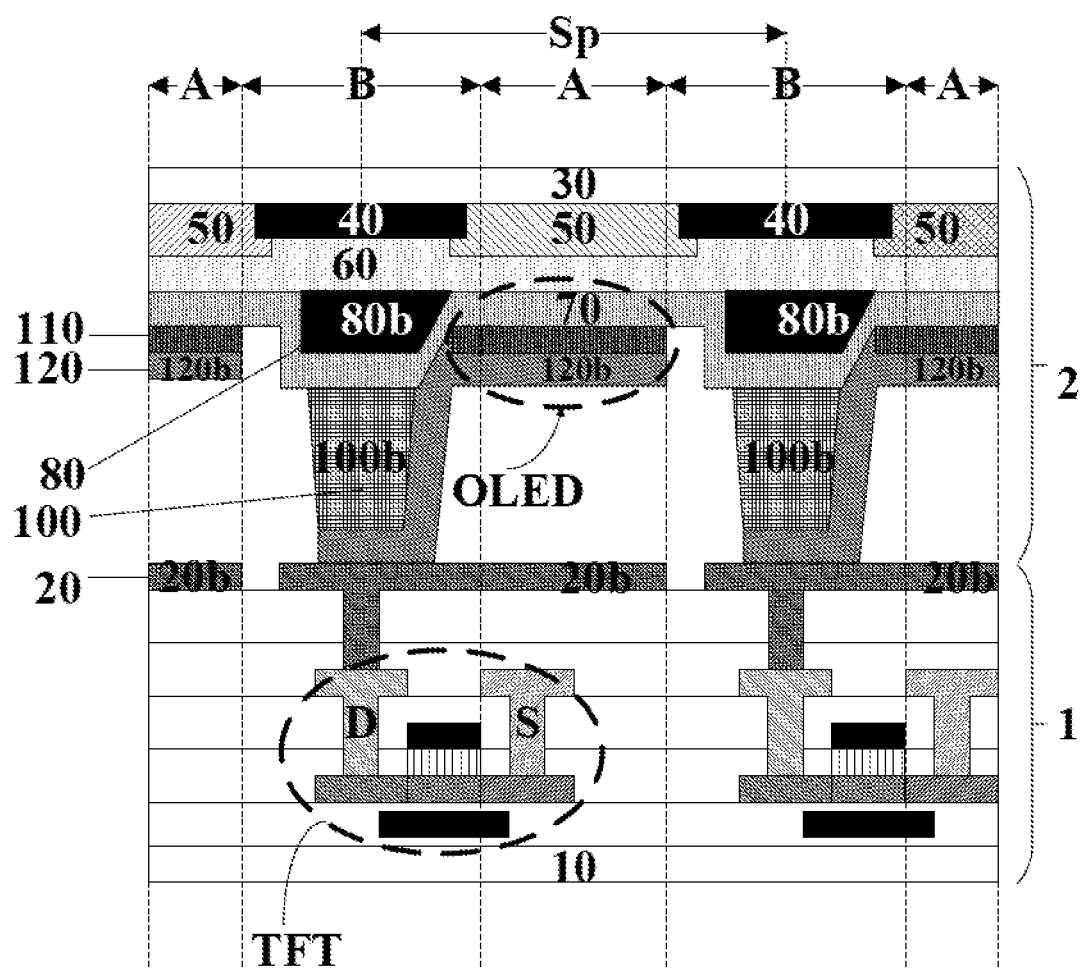
FIG. 1 is a schematic diagram illustrating the structure of an organic light emitting diode display panel in some embodiments according to the present disclosure.

FIG. 1 is a schematic diagram illustrating the structure of an organic light emitting diode display panel in some embodiments according to the present disclosure. Referring to FIG. 1, the organic light emitting diode display panel includes a plurality of subpixels Sp, and includes an array substrate 1 and a counter substrate 2 facing the array substrate 1. The counter substrate 2 includes a plurality of organic light emitting diodes OLED, the array substrate 1 includes a first base substrate 10 and a plurality of thin film transistors TFT on the first base substrate 10 for driving light emission of the plurality of organic light emitting diodes OLED in the counter substrate 2. In the present organic light emitting diode display panel, the plurality of thin film transistors TFT and the plurality of organic light emitting diodes OLED are disposed in two separate substrates facing each other. By disposing the plurality of organic light emitting diodes OLED in the counter substrate 2 rather than in the array substrate 1, the plurality of organic light emitting diodes OLED can be disposed on a substantially flat surface (e.g., a surface absent large segmental differences), effectively avoiding occurrence of defects in the fabrication process due to the large segmental differences. By disposing the plurality of organic light emitting diodes OLED on the counter substrate 2, a relatively larger alignment error between the counter substrate 2 and the array substrate 1 during the assembling process of the organic light emitting diode display panel can also be tolerated. Moreover, the present organic light emitting diode display panel obviates the need to have a pixel definition layer in the array substrate 1 as the plurality of organic light emitting diodes OLED are in the counter substrate 2.

Referring to FIG. 1, the counter substrate 2 has a subpixel region A and an inter-subpixel region B. In some embodiments, the counter substrate 2 in the inter-subpixel region B includes a second base substrate 30, a spacer layer 100 on a side of the second base substrate 30 proximal to the first base substrate 10 and configured to maintain a spacing between the array substrate 1 and the counter substrate 2, and a first electrode layer 120 on a side of the spacer layer 100 distal to the second base substrate 30. Optionally, the first electrode layer 120 is a substantially transparent electrode layer. As used herein, the term "substantially transparent" means at least 50 percent (e.g., at least 60 percent, at least 70 percent, at least 80 percent, at least 90 percent, and at least 95 percent) of light in the visible wavelength range transmitted therethrough.

Various appropriate substantially transparent electrode materials and various appropriate fabricating methods may be used to make the first electrode layer 120. For example, an electrode material may be deposited on the substrate by a plasma-enhanced chemical vapor deposition (PECVD) process and patterned. Examples of appropriate substantially transparent electrode materials for making the first electrode layer 120 include, but are not limited to, indium tin oxide, indium zinc oxide, aluminum zinc oxide, indium gallium zinc oxide, aluminum zinc tin oxide, nano-metals such as nano-silver, conductive resins, graphene, carbon nanotubes, and the like.

As used herein, a subpixel region refers to a light emission region of a subpixel, such as a region corresponding to a pixel electrode in a liquid crystal display, or a region corresponding to a light emissive layer in an organic light emitting diode display panel. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display, or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Referring to FIG. 1, the first electrode layer 120 in some embodiments is electrically connected to the plurality of the thin film transistors TFT in the array substrate 1. In some embodiments, the array substrate 1 further includes a second electrode layer 20 on a side of the plurality of thin film transistors TFT distal to the first base substrate 10. Optionally, the second electrode layer 20 includes a plurality of second electrode blocks 20b, each of which being electrically connected to a drain electrode D of one of the plurality of thin film transistors TFT. Optionally, the first electrode layer 120 in the counter substrate 2 includes a plurality of first electrode blocks 120b, each of which being electrically connected to one of the plurality of second electrode blocks 20b in the array substrate 1, and in turn electrically connected to the drain electrode D of one of the plurality of thin film transistors TFT. Each of the plurality of thin film transistors TFT further includes a source electrode S.

In some embodiments, the second electrode layer 20 is a reflective electrode layer, and the plurality of second electrode blocks 20b are a plurality of reflective electrode blocks. As used herein, the term "reflective" mean at least 50 percent (e.g., at least 60 percent, at least 70 percent, at least 80 percent, at least 90 percent, and at least 95 percent) reflectivity of light in the visible wavelength range. Light emitted from each of the plurality of organic light emitting diodes OLED is reflected by one of the plurality of second electrode blocks 20b, the reflected light emits out of the organic light emitting diode display panel from the second base substrate 30 along a direction away from the second electrode layer 20. Optionally, the organic light emitting diode display panel is a top emission-type organic light emitting diode display panel.

Various appropriate reflective electrode materials and various appropriate fabricating methods may be used to make the second electrode layer 20. For example, an electrode material may be deposited on the substrate, e.g., by sputtering or vapor deposition or solution coating; and patterned. Examples of appropriate electrode materials for making the second electrode layer 20 include, but are not limited to, silver, molybdenum, aluminum, titanium, gold, copper, hafnium, tantalum, alloys such as aluminum Neodymium (AlNd), molybdenum Niobium (MoNb), and laminates such as a molybdenum-aluminum-molybdenum laminated structure, a MoNb-copper-MoNb laminated structure, and a AlNd-molybdenum-AlNd laminated structure.

In some embodiments, an orthographic projection of each of the plurality of second electrode blocks 20b on the first base substrate 10 at least partially overlaps with an orthographic projection of the corresponding subpixel region A on the first base substrate 10. Optionally, the orthographic projection of each of the plurality of second electrode blocks 20b on the first base substrate 10 substantially covers the orthographic projection of the corresponding subpixel region A on the first base substrate 10.

In some embodiments, the orthographic projection of each of the plurality of second electrode blocks 20b on the first base substrate 10 at least partially overlaps with an orthographic projection of the corresponding one of the plurality of first electrode blocks 120b on the first base substrate 10. Optionally, the orthographic projection of each of the plurality of second electrode blocks 20b on the first base substrate 10 substantially covers the orthographic projection of the corresponding one of the plurality of first electrode blocks 120b on the first base substrate 10.

In some embodiments, the orthographic projection of each of the plurality of second electrode blocks 20b on the first base substrate 10 at least partially overlaps with an orthographic projection of the corresponding one of the plurality of organic light emitting diodes OLED on the first base substrate 10. Optionally, the orthographic projection of each of the plurality of second electrode blocks 20b on the first base substrate 10 substantially covers the orthographic projection of the corresponding one of the plurality of organic light emitting diodes OLED on the first base substrate 10.

Figure 2:
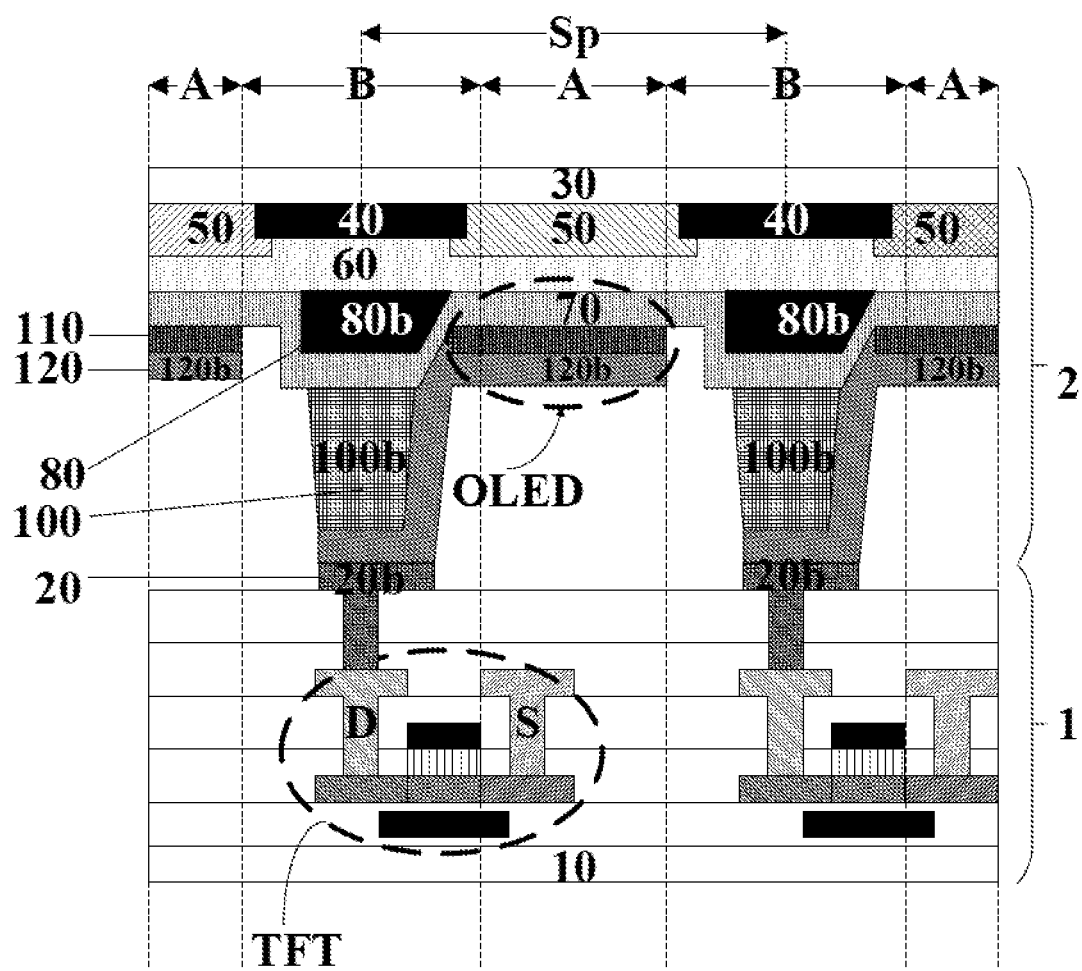
FIG. 2 is a schematic diagram illustrating the structure of an organic light emitting diode display panel in some embodiments according to the present disclosure.

In some embodiments, the second electrode layer 20 is limited to the inter-subpixel region B. FIG. 2 is a schematic diagram illustrating the structure of an organic light emitting diode display panel in some embodiments according to the present disclosure. Referring to FIG. 2, in some embodiments, each of the plurality of second electrode blocks 20b functions as an intermediate connecting component for electrically connecting the one of the plurality of first electrode blocks 120b and the drain electrode D of one of the plurality of thin film transistors TFT. Optionally, the organic light emitting diode display panel is a bottom emission-type organic light emitting diode display panel. Optionally, the organic light emitting diode display panel is a dual emission-type organic light emitting diode display panel.

Referring to FIG. 1 and FIG. 2, in some embodiments, the counter substrate 2 in the subpixel region A includes a third electrode layer 70 on a side of the second base substrate 30 proximal to the first base substrate 10; an organic light emitting layer 110 on a side of the third electrode layer 70 distal to the second base substrate 30; and the first electrode layer 120 on a side of the organic light emitting layer 110 distal to the third electrode layer 70. Optionally, each of the plurality of first electrode blocks 120b in each of the plurality of subpixels Sp extends from the subpixel region A into the inter-subpixel region B. Optionally, the third electrode layer 70 is a cathode for the plurality of organic light emitting diodes OLED, and each of the plurality of first electrode blocks 120b is an anode for one of the plurality of organic light emitting diodes OLED. Optionally, the third electrode layer 70 is an anode for the plurality of organic light emitting diodes OLED, and each of the plurality of first electrode blocks 120b is a cathode for one of the plurality of organic light emitting diodes OLED. Optionally, the third electrode layer 70 is a substantially transparent electrode layer.

Various appropriate substantially transparent electrode materials and various appropriate fabricating methods may be used to make the third electrode layer 70. For example, an electrode material may be deposited on the substrate by a plasma-enhanced chemical vapor deposition (PECVD) process and patterned. Examples of appropriate substantially transparent electrode materials for making the third electrode layer 70 include, but are not limited to, indium tin oxide, indium zinc oxide, aluminum zinc oxide, indium gallium zinc oxide, aluminum zinc tin oxide, nano-metals such as nano-silver, conductive resins, graphene, carbon nanotubes, and the like.

Referring to FIG. 1, in some embodiments, the orthographic projection of each of the plurality of second electrode blocks 20b on the first base substrate 10 at least partially overlaps with an orthographic projection of the organic light emitting layer 110 in one of the plurality of subpixels Sp on the first base substrate 10. Optionally, the orthographic projection of each of the plurality of second electrode blocks 20b on the first base substrate 10 substantially covers the orthographic projection of the organic light emitting layer 110 in one of the plurality of subpixels Sp on the first base substrate 10. Optionally, an orthographic projection of the second electrode layer 20 on the first base substrate 10 at least partially overlaps with the orthographic projection of the organic light emitting layer 110 on the first base substrate 10. Optionally, the orthographic projection of the second electrode layer 20 on the first base substrate 10 substantially covers with the orthographic projection of the organic light emitting layer 110 on the first base substrate 10.

Referring to FIG. 2, in some embodiments, the orthographic projection of each of the plurality of second electrode blocks 20b on the first base substrate 10 is substantially non-overlapping with the orthographic projection of the organic light emitting layer 110 in one of the plurality of subpixels Sp on the first base substrate 10. Optionally, the orthographic projection of the second electrode layer 20 on the first base substrate 10 is substantially non-overlapping with the orthographic projection of the organic light emitting layer 110 on the first base substrate 10.

Figure 3:
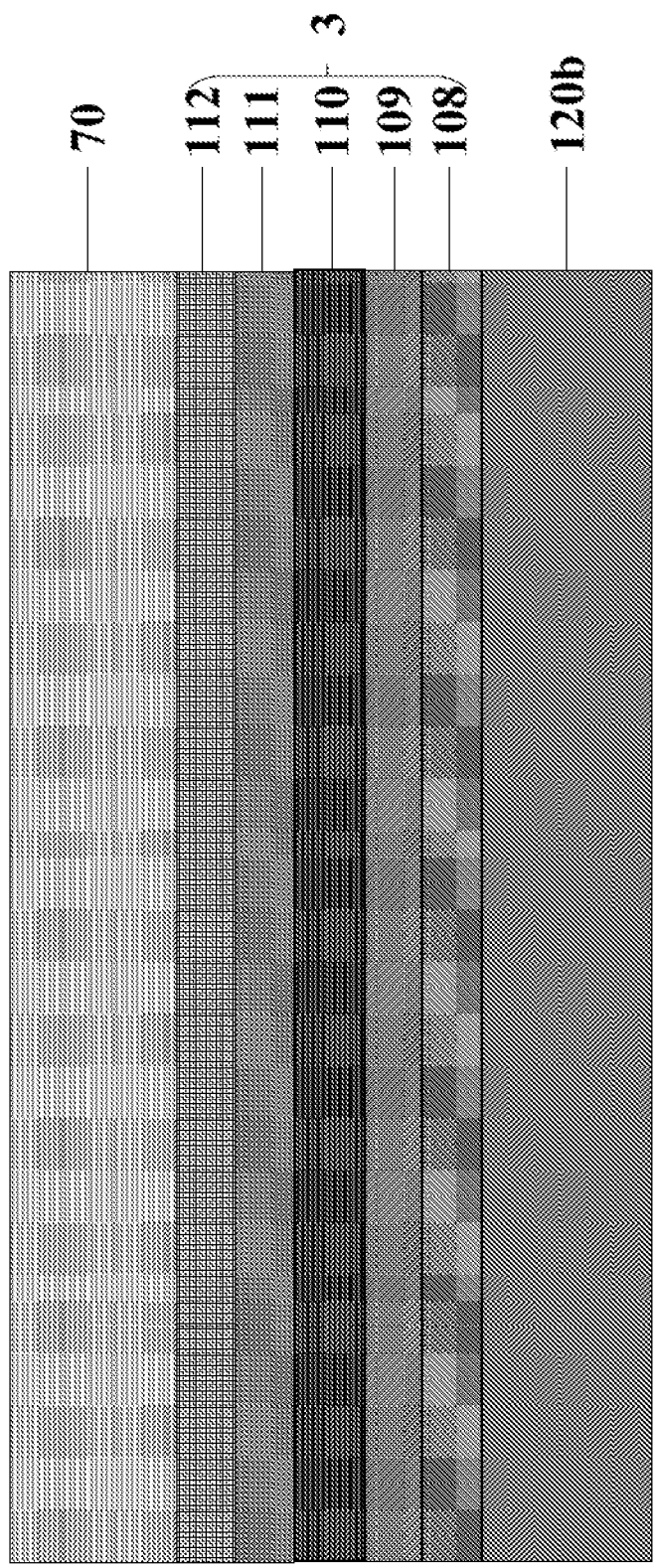
FIG. 3 is a zoom-in view of one of the plurality of organic light emitting diodes in an organic light emitting diode display panel in some embodiments according to the present disclosure.

FIG. 3 is a zoom-in view of one of the plurality of organic light emitting diodes in an organic light emitting diode display panel in some embodiments according to the present disclosure. Referring to FIG. 3, the counter substrate 2 in the subpixel region A in some embodiments further includes one or more organic functional layers. The organic light emitting layer 110 is one of the multiple layers of an organic layer 3. In one example, the organic layer 3 includes a hole injection layer 108 on one of the plurality of first electrode blocks 120b, a hole transport layer 109 on a side of the hole injection layer 108 distal to the one of the plurality of first electrode blocks 120b, an organic light emitting layer 110 on a side of the hole transport layer 109 distal to the hole injection layer 108, an electron transport layer 111 on a side of the organic light emitting layer 110 distal to the hole transport layer 109, and an electron injection layer 112 on a side of the electron transport layer 111 distal to the organic light emitting layer 110.

In some embodiments, and referring to FIG. 1 and FIG. 2, the spacer layer 100 includes a plurality of spacer blocks 100b. Optionally, each of the plurality of first electrode blocks 120b is on a side of one of the plurality of spacer blocks 100b distal to the second base substrate 30 in the inter-subpixel region B. Because each of the plurality of first electrode blocks 120b in the counter substrate 2 is electrically connected to the drain electrode D in one of the plurality of thin film transistors TFT in the array substrate 1 through one of the plurality of second electrode blocks 20b in the array substrate 1, in some embodiments, each of the plurality of subpixels Sp includes at least one of the plurality of the spacer blocks 100b. Optionally, each of the plurality of subpixels Sp includes a single one of the plurality of the spacer blocks 100b. Each of the plurality of the spacer blocks 100b protruding form a surface the counter substrate 2 toward the array substrate 1, one of the plurality of first electrode blocks 120b disposed on one of the plurality of the spacer blocks 100b in the counter substrate 2 is in direct contact with one of the plurality of second electrode blocks 20b in the array substrate 1.

In some embodiments, the counter substrate 2 in the inter-subpixel region B further comprises a fourth electrode layer 80. Optionally, the fourth electrode layer 80 is an auxiliary electrode for the third electrode layer 70, and is electrically connected to the third electrode layer 70. Optionally, the fourth electrode layer 80 is made of a material having a high conductivity, e.g., a metallic material. Various appropriate electrode materials and various appropriate fabricating methods may be used to make the fourth electrode layer 80. For example, an electrode material may be deposited on the substrate, e.g., by sputtering or vapor deposition or solution coating; and patterned. Examples of appropriate electrode materials for making the fourth electrode layer 80 include, but are not limited to, molybdenum, aluminum, titanium, gold, copper, hafnium, tantalum, alloys such as aluminum Neodymium (AlNd), molybdenum Niobium (MoNb), and laminates such as a molybdenum-aluminum-molybdenum laminated structure, a MoNb-copper-MoNb laminated structure, and a AlNd-molybdenum-AlNd laminated structure.

Referring to FIG. 1 and FIG. 2, the fourth electrode layer 80 in some embodiments includes a plurality of fourth electrode blocks 80b. Each of the plurality of fourth electrode blocks 80b is on a side of one of the plurality of spacer blocks 100b proximal to the second base substrate 30, and each of the plurality of fourth electrode blocks 80b is electrically connected to the third electrode layer 70. Optionally, an orthographic projection of each of the plurality of fourth electrode blocks 80b on the second base substrate 30 at least partially overlaps with an orthographic projection of one of the plurality of spacer blocks 100b on the second base substrate 30. Optionally, the orthographic projection of each of the plurality of fourth electrode blocks 80b on the second base substrate 30 substantially overlaps with the orthographic projection of one of the plurality of spacer blocks 100b on the second base substrate 30. Optionally, the orthographic projection of each of the plurality of fourth electrode blocks 80b on the second base substrate 30 substantially covers the orthographic projection of one of the plurality of spacer blocks 100b on the second base substrate 30.

Figure 4:
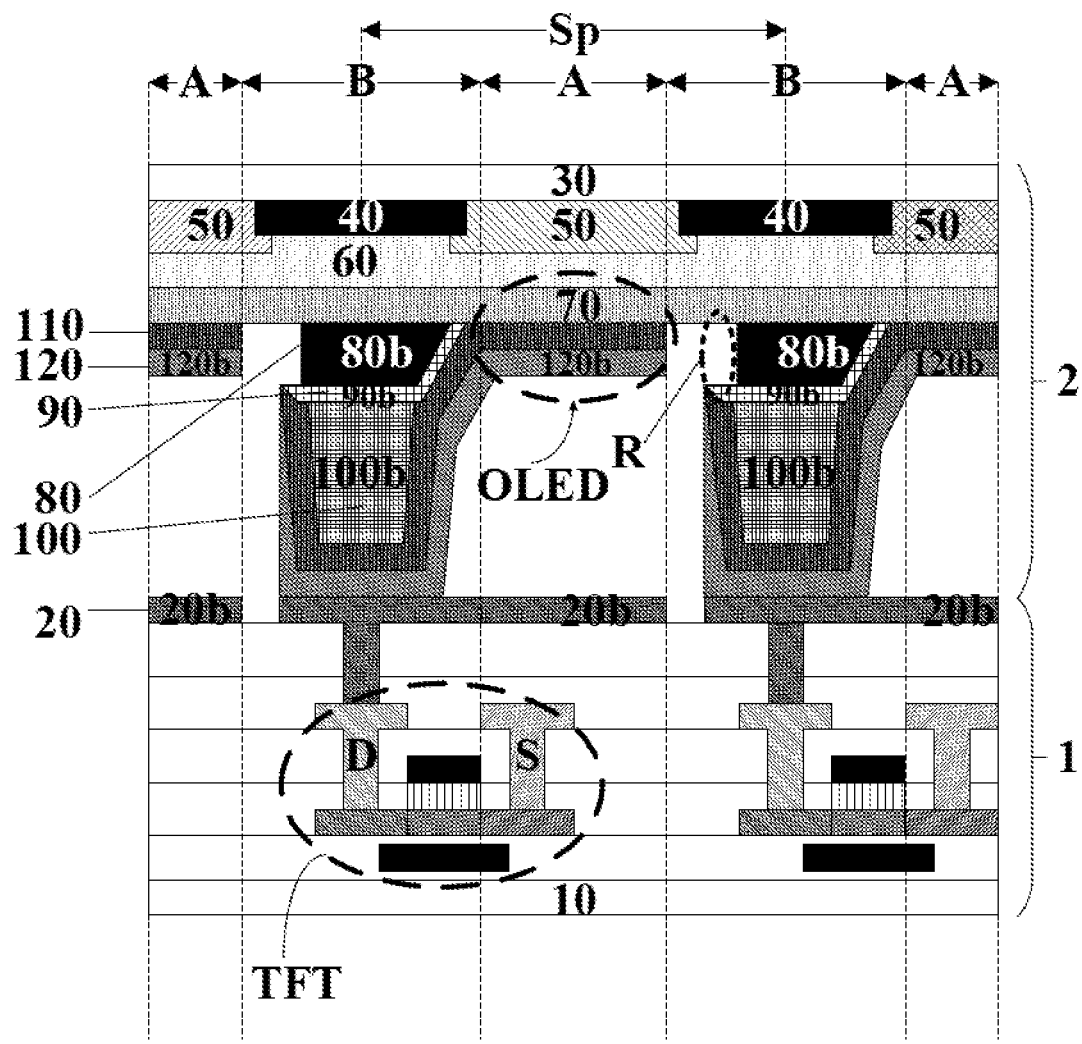
FIG. 4 is a schematic diagram illustrating the structure of an organic light emitting diode display panel in some embodiments according to the present disclosure.

In some embodiments, and referring to FIG. 1 and FIG. 2, the fourth electrode layer 80 is on a side of the third electrode layer 70 proximal to the second base substrate 30, and each of the plurality of fourth electrode blocks 80b is on a side of the third electrode layer 70 proximal to the second base substrate 30. FIG. 4 is a schematic diagram illustrating the structure of an organic light emitting diode display panel in some embodiments according to the present disclosure. Referring to FIG. 4, in some embodiments, the fourth electrode layer 80 is on a side of the third electrode layer 70 distal to the second base substrate 30, and each of the plurality of fourth electrode blocks 80b is on a side of the third electrode layer 70 distal to the second base substrate 30. By having the fourth electrode layer 80 is on a side of the third electrode layer 70 distal to the second base substrate 30, the adhesion of the fourth electrode layer 80 (e.g., a metallic electrode layer) to the counter substrate 2 can be greatly enhanced. For example, an adhesion of a metallic fourth electrode layer 80 to the electrode material of the third electrode layer 70 is much greater than an adhesion of a metallic fourth electrode layer 80 to an organic material in a layer (e.g., an overcoat layer 60) in the counter substrate 2.

Referring to FIG. 4, in some embodiments, the counter substrate 2 in the inter-subpixel region B further includes an insulating layer 90 between the spacer layer 100 and the fourth electrode layer 80. The insulating layer 90 is absent in the subpixel region A and present in the inter-subpixel region B. Optionally, the insulating layer 90 includes a plurality of insulating blocks 90b. Optionally, each of the plurality of insulating blocks 90b is on a side of one of the plurality of fourth electrode blocks 80b distal to the second base substrate 30. By having an insulating layer 90 between the spacer layer 100 and the fourth electrode layer 80 (e.g., a metallic electrode layer), the adhesion of the spacer layer 100 to the counter substrate 2 can be greatly enhanced, avoiding defects due to separation of the plurality of spacer blocks 100b from the counter substrate 2.

Referring to FIG. 4, the organic light emitting diode display panel in some embodiments includes a recess R defined by one of the plurality of insulating blocks 90b, one of the plurality of fourth electrode blocks 80b, and the third electrode layer 70. For example, the recess R is defined by a side surface of the one of the plurality of fourth electrode blocks 80b, a surface of the third electrode layer 70 closest to the insulating layer, and a surface of the one of the plurality of insulating blocks 90b closest to the third electrode layer 70. By having a recess R recessing into the one of the plurality of fourth electrode blocks 80b, the one of the plurality of fourth electrode blocks 80b is insulated from an adjacent organic light emitting diode of the plurality of organic light emitting diodes OLED in an adjacent subpixel of the plurality of subpixels Sp. For example, by having the recess R, the one of the plurality of fourth electrode blocks 80b is insulated from the organic light emitting layer 110 in an adjacent subpixel of the plurality of subpixels Sp. Optionally, an orthographic projection of the one of the plurality of insulating blocks 90b on the second base substrate 30 substantially covers a combination of an orthographic projection of the recess R on the second base substrate 30 and an orthographic projection of one of the plurality of fourth electrode blocks 80b adjacent to the recess R on the second base substrate 30.

In some embodiments, the organic light emitting layer 110 in each of the plurality of subpixels Sp extends from the subpixel region A into the inter-subpixel region B, e.g., the counter substrate 2 in the inter-subpixel region B further includes the organic light emitting layer 110 between the spacer layer 100 and the first electrode layer 120. The organic light emitting layer 110 in the inter-subpixel region B in each of the plurality of subpixels Sp is sandwiched between one of the spacer blocks 100b and one of the plurality of first electrode blocks 120b. In fabricating the organic light emitting diode display panel, the insulating layer 90 is formed on a side of the fourth electrode layer 80 distal to the third electrode layer 70, the fourth electrode layer 80 is over-etched on one side to form the recess R. Subsequently, an organic light emitting material can be deposited on a side of the spacer layer 100 distal to the insulating layer 90 to form the organic light emitting layer 110, e.g., without patterning due to the existence of the recess R. Similarly, an electrode material is then deposited on a side of the organic light emitting layer 110 distal to the spacer layer 100, e.g., without patterning due to the existence of the recess R. By having the recess R, the fabrication process can be much simplified.

In some embodiments, the counter substrate 2 further includes a black matrix 40 on the second base substrate 30 and in the inter-subpixel region B; and a color filter 50 on the second base substrate 30 and in the subpixel region A. Optionally, the counter substrate 2 further includes an overcoat layer 60 on a side of the black matrix 40 and the color filter 50 distal to the second base substrate 30. Optionally, the third electrode layer 70 is on a side of the overcoat layer 60 distal to the second base substrate 30.

Referring to FIG. 1, FIG. 2, and FIG. 3, the array substrate 1 in some embodiments is absent of any pixel definition layer. Because the plurality of organic light emitting diodes OLED are disposed in the counter substrate 2, it is not required to form a pixel definition layer in the array substrate 1.

Figure 5:
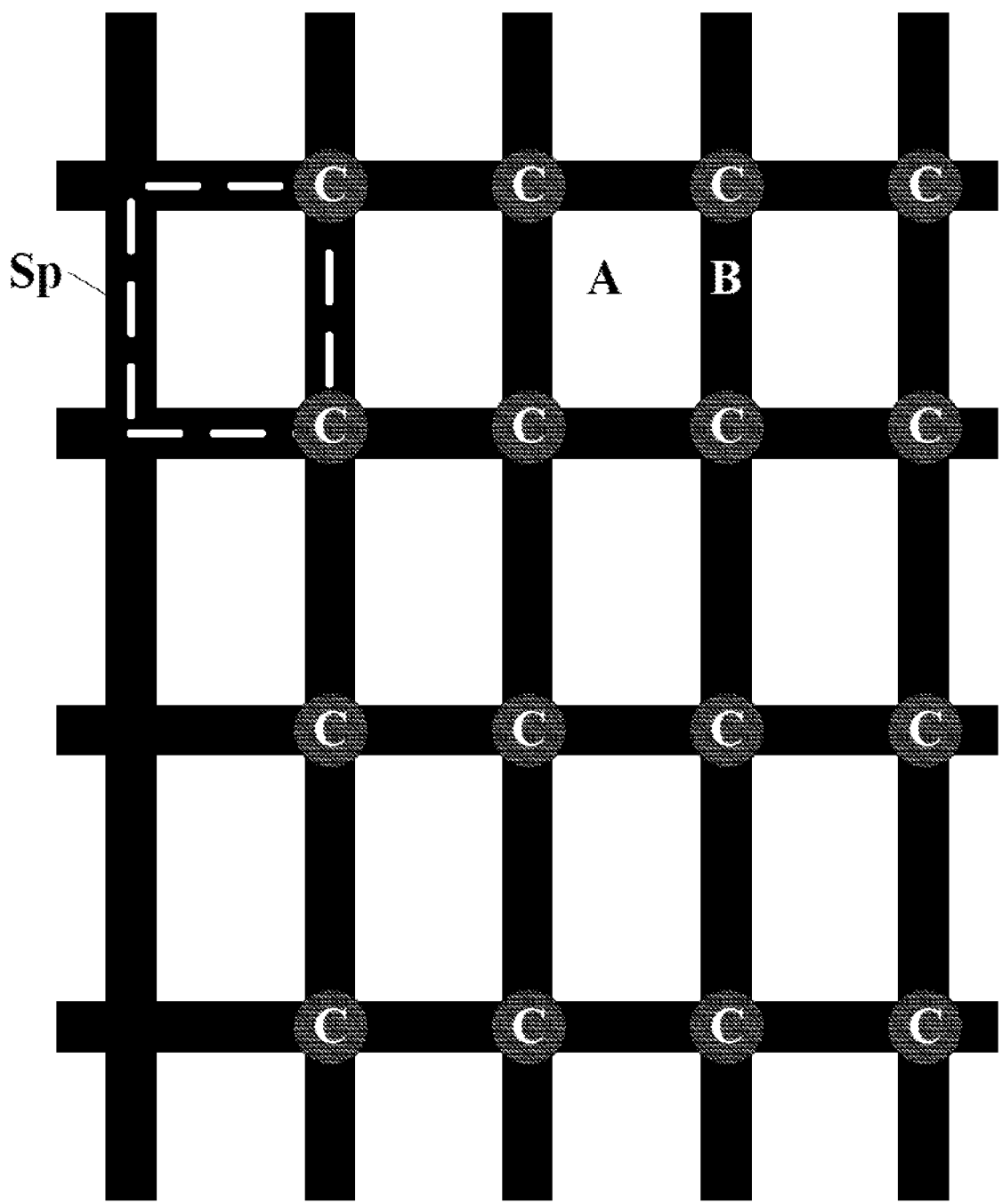
FIG. 5 is a plan view of an organic light emitting diode display panel in some embodiments according to the present disclosure.

FIG. 5 is a plan view of an organic light emitting diode display panel in some embodiments according to the present disclosure. Referring to FIG. 5, the organic light emitting diode display panel in some embodiments has a subpixel region A and an inter-subpixel region B. Moreover, the organic light emitting diode display panel has a plurality of regions C in which the plurality of spacer blocks 100b are disposed, respectively. Referring to FIG. 4 and FIG. 5, in each of the plurality of regions C having the plurality of spacer blocks 100b, the first electrode layer 120 is direct contact with (e.g., without any intervening layer or structure) the array substrate 1. Optionally, in the plurality of regions C of the array substrate 1 having the plurality of spacer blocks 100b, the first electrode layer 120 is direct contact with (e.g., without any intervening layer or structure) the second electrode layer 20. In FIG. 5, the organic light emitting diode display panel has at least one of the plurality of regions C in each subpixel Sp.

In another aspect, the present disclosure provides an organic light emitting diode counter substrate having a subpixel region and an inter-subpixel region, and includes a plurality of subpixels. In some embodiments, the organic light emitting diode counter substrate in the inter-subpixel region includes a second base substrate; a black matrix on the second base substrate; a spacer layer on a side of the black matrix distal to the second base substrate; and a first electrode layer on a side of the spacer layer distal to the black matrix. In some embodiments, the organic light emitting diode counter substrate in the subpixel region includes a third electrode layer on the second base substrate; an organic light emitting layer on a side of the third electrode layer distal to the second base substrate; and the first electrode layer on a side of the organic light emitting layer distal to the third electrode layer. Optionally, the first electrode layer includes a plurality of first electrode blocks.

Optionally, each of the plurality of first electrode blocks in each of a plurality of subpixels extends from the subpixel region into the inter-subpixel region.

Figure 6:
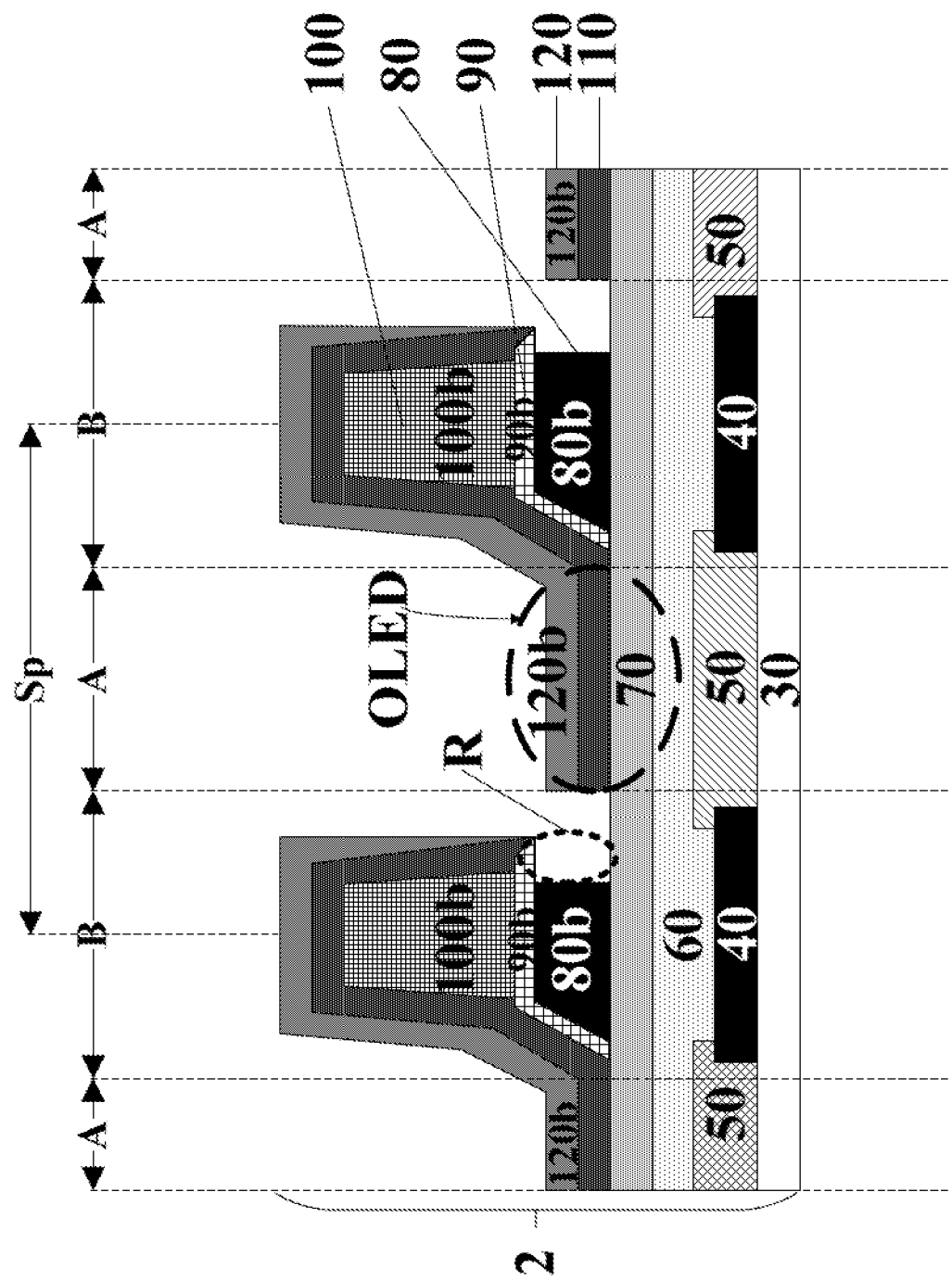
FIG. 6 is a schematic diagram illustrating the structure of an organic light emitting diode counter substrate in some embodiments according to the present disclosure.

FIG. 6 is a schematic diagram illustrating the structure of an organic light emitting diode counter substrate in some embodiments according to the present disclosure. Referring to FIG. 6, the organic light emitting diode counter substrate in some embodiments includes a plurality of subpixels Sp, and has a subpixel region A and an inter-subpixel region B. The organic light emitting diode counter substrate includes a plurality of organic light emitting diodes OLED, and is absent of any thin film transistor. The organic light emitting diode counter substrate has a subpixel region A and an inter-subpixel region B. In some embodiments, the organic light emitting diode counter substrate in the inter-subpixel region B includes a second base substrate 30, a spacer layer 100 on the second base substrate 30, and a first electrode layer 120 on a side of the spacer layer 100 distal to the second base substrate 30. Optionally, the first electrode layer 120 is a substantially transparent electrode layer. Optionally, the first electrode layer 120 includes a plurality of first electrode blocks 120b.

In some embodiments, the organic light emitting diode counter substrate in the subpixel region A includes a third electrode layer 70 on the second base substrate 30; an organic light emitting layer 110 on a side of the third electrode layer 70 distal to the second base substrate 30; and the first electrode layer 120 on a side of the organic light emitting layer 110 distal to the third electrode layer 70. Optionally, each of the plurality of first electrode blocks 120b in each of the plurality of subpixels Sp extends from the subpixel region A into the inter-subpixel region B. Optionally, the third electrode layer 70 is a cathode for the plurality of organic light emitting diodes OLED, and each of the plurality of first electrode blocks 120b is an anode for one of the plurality of organic light emitting diodes OLED. Optionally, the third electrode layer 70 is an anode for the plurality of organic light emitting diodes OLED, and each of the plurality of first electrode blocks 120b is a cathode for one of the plurality of organic light emitting diodes OLED. Optionally, the third electrode layer 70 is a substantially transparent electrode layer.

In some embodiments, the spacer layer 100 includes a plurality of spacer blocks 100b. Optionally, each of the plurality of first electrode blocks 120b is on a side of one of the plurality of spacer blocks 100b distal to the second base substrate 30 in the inter-subpixel region B. Optionally, each of the plurality of subpixels Sp includes at least one of the plurality of the spacer blocks 100b. Optionally, each of the plurality of subpixels Sp includes a single one of the plurality of the spacer blocks 100b.

In some embodiments, the organic light emitting diode counter substrate in the inter-subpixel region B further comprises a fourth electrode layer 80. Optionally, the fourth electrode layer 80 is an auxiliary electrode for the third electrode layer 70, and is electrically connected to the third electrode layer 70. Optionally, the fourth electrode layer 80 is made of a material having a high conductivity, e.g., a metallic material. The fourth electrode layer 80 in some embodiments includes a plurality of fourth electrode blocks 80b. Each of the plurality of fourth electrode blocks 80b is on a side of one of the plurality of spacer blocks 100b proximal to the second base substrate 30, and each of the plurality of fourth electrode blocks 80b is electrically connected to the third electrode layer 70. Optionally, an orthographic projection of each of the plurality of fourth electrode blocks 80b on the second base substrate 30 at least partially overlaps with an orthographic projection of one of the plurality of spacer blocks 100b on the second base substrate 30. Optionally, the orthographic projection of each of the plurality of fourth electrode blocks 80b on the second base substrate 30 substantially overlaps with the orthographic projection of one of the plurality of spacer blocks 100b on the second base substrate 30. Optionally, the orthographic projection of each of the plurality of fourth electrode blocks 80b on the second base substrate 30 substantially covers the orthographic projection of one of the plurality of spacer blocks 100b on the second base substrate 30.

In some embodiments, the fourth electrode layer 80 is on a side of the third electrode layer 70 proximal to the second base substrate 30, and each of the plurality of fourth electrode blocks 80b is on a side of the third electrode layer 70 proximal to the second base substrate 30. In some embodiments, the fourth electrode layer 80 is on a side of the third electrode layer 70 distal to the second base substrate 30, and each of the plurality of fourth electrode blocks 80b is on a side of the third electrode layer 70 distal to the second base substrate 30.

In some embodiments, the organic light emitting diode counter substrate in the inter-subpixel region B further includes an insulating layer 90 between the spacer layer 100 and the fourth electrode layer 80. The insulating layer 90 is absent in the subpixel region A and present in the inter-subpixel region B. Optionally, the insulating layer 90 includes a plurality of insulating blocks 90b. Optionally, each of the plurality of insulating blocks 90b is on a side of one of the plurality of fourth electrode blocks 80b distal to the second base substrate 30. In some embodiments, the organic light emitting diode counter substrate includes a recess R defined by one of the plurality of insulating blocks 90b, one of the plurality of fourth electrode blocks 80b, and the third electrode layer 70. Optionally, an orthographic projection of the one of the plurality of insulating blocks 90b on the second base substrate 30 substantially covers a combination of an orthographic projection of the recess R on the second base substrate 30 and an orthographic projection of one of the plurality of fourth electrode blocks 80b adjacent to the recess R on the second base substrate 30.

In some embodiments, the organic light emitting layer 110 in each of the plurality of subpixels Sp extends from the subpixel region A into the inter-subpixel region B, e.g., the organic light emitting diode counter substrate in the inter-subpixel region B further includes the organic light emitting layer 110 between the spacer layer 100 and the first electrode layer 120. The organic light emitting layer 110 in the inter-subpixel region B in each of the plurality of subpixels Sp is sandwiched between one of the spacer blocks 100b and one of the plurality of first electrode blocks 120b.

In some embodiments, the organic light emitting diode counter substrate further includes a black matrix 40 on the second base substrate 30 and in the inter-subpixel region B; and a color filter 50 on the second base substrate 30 and in the subpixel region A. Optionally, the organic light emitting diode counter substrate further includes an overcoat layer 60 on a side of the black matrix 40 and the color filter 50 distal to the second base substrate 30. Optionally, the third electrode layer 70 is on a side of the overcoat layer 60 distal to the second base substrate 30.

In another aspect, the present disclosure provides an array substrate for an organic light emitting diode display panel. In some embodiments, the array substrate includes a plurality of subpixels, and has a subpixel region and an inter-subpixel region. In some embodiments, the array substrate includes a first base substrate and a plurality of thin film transistors on the first base substrate for driving light emission of the plurality of organic light emitting diodes in the counter substrate. Optionally, the array substrate further includes a second electrode layer on a side of the plurality of thin film transistors distal to the first base substrate. Optionally, the array substrate is absent of a pixel definition layer.

Figure 7:
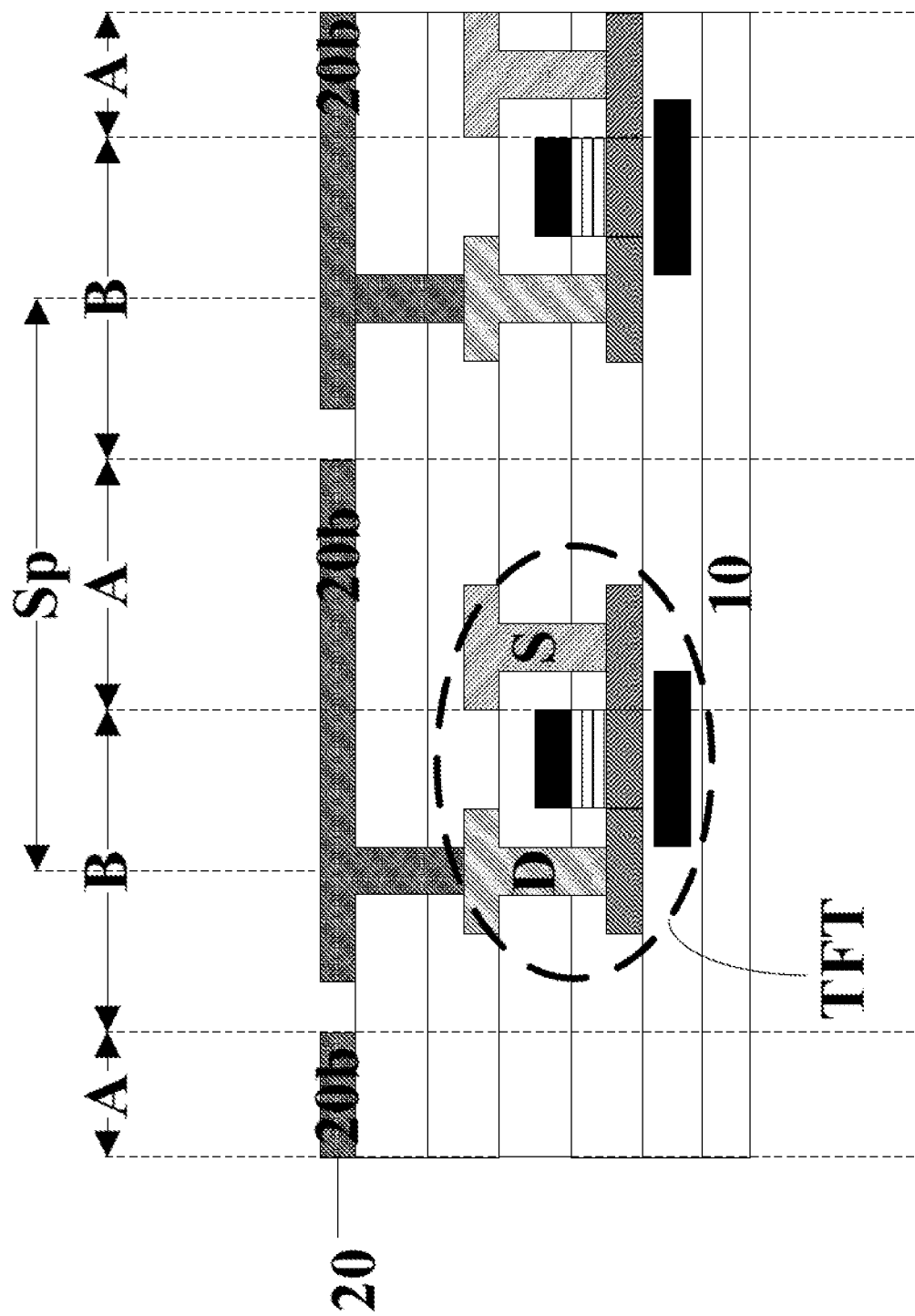
FIG. 7 is a schematic diagram illustrating the structure of an array substrate in some embodiments according to the present disclosure.

FIG. 7 is a schematic diagram illustrating the structure of an array substrate in some embodiments according to the present disclosure. Referring to FIG. 7, the array substrate includes a first base substrate 10, a plurality of thin film transistors TFT on the first base substrate 10, and a second electrode layer 20 on a side of the plurality of thin film transistors TFT distal to the first base substrate 10. The array substrate is absent of a pixel definition layer. Optionally, the second electrode layer 20 includes a plurality of second electrode blocks 20b, each of which being electrically connected to a drain electrode D of one of the plurality of thin film transistors TFT. Optionally, the first electrode layer in the counter substrate includes a plurality of first electrode blocks, each of which being electrically connected to one of the plurality of second electrode blocks 20b in the array substrate 1, and in turn electrically connected to the drain electrode D of one of the plurality of thin film transistors TFT. The second electrode layer 20 in the present array substrate is a layer most distal to the first base substrate 10. Optionally, at least a portion of the second electrode layer 20 is exposed, e.g., at least a portion of the second electrode layer 20 is not covered by any layer. Optionally, the second electrode layer 20 has a first side proximal to the first base substrate 10 and a second side distal to the first base substrate 10, the second side opposite to the first side. Optionally, the second side of the second electrode layer 20 is substantially exposed, e.g., without any layer covering the second side.

In some embodiments, the second electrode layer 20 is a reflective electrode layer, and the plurality of second electrode blocks 20b are a plurality of reflective electrode blocks. In some embodiments, an orthographic projection of each of the plurality of second electrode blocks 20b on the first base substrate 10 at least partially overlaps with an orthographic projection of the corresponding subpixel region A on the first base substrate 10. Optionally, the orthographic projection of each of the plurality of second electrode blocks 20b on the first base substrate 10 substantially covers the orthographic projection of the corresponding subpixel region A on the first base substrate 10.

In some embodiments, the second electrode layer 20 is limited to the inter-subpixel region B.

In another aspect, the present disclosure provides a method of fabricating an organic light emitting diode display panel having a plurality of subpixels. In some embodiments, the method includes forming a counter substrate; forming an array substrate; and assembling the counter substrate and the array substrate together. In some embodiments, the step of forming the counter substrate includes forming a plurality of organic light emitting diodes; and the step of forming the array substrate includes forming a plurality of thin film transistors on a first base substrate for driving light emission of the plurality of organic light emitting diodes in the counter substrate.

In some embodiments, the step of forming the array substrate further includes forming a second electrode layer on a side of the plurality of thin film transistors distal to the first base substrate, the second electrode layer is formed to include a plurality of second electrode blocks. Each of the plurality of second electrode blocks is formed to be electrically connected to a drain electrode of one of the plurality of thin film transistors. Optionally, the second electrode layer is made of a reflective electrode material, and the plurality of second electrode blocks are a plurality of reflective electrode blocks.

In some embodiments, the step of forming the counter substrate includes, in the inter-subpixel region, forming a spacer layer on a second base substrate; and forming a first electrode layer on a side of the spacer layer distal to the second base substrate. During the step of assembling the counter substrate and the array substrate, the first electrode layer is electrically connected to the plurality of the thin film transistors in the array substrate. Optionally, the first electrode layer is formed to include a plurality of first electrode blocks. During the step of assembling the counter substrate and the array substrate, each of the plurality of first electrode blocks is electrically connected to one of the plurality of second electrode blocks in the array substrate.

In some embodiments, the step of forming the counter substrate includes, in the subpixel region, forming a third electrode layer on the second base substrate; forming an organic light emitting layer on a side of the third electrode layer distal to the second base substrate; and forming a first electrode layer on a side of the organic light emitting layer distal to the third electrode layer. Optionally, each of the plurality of first electrode blocks in each of the plurality of subpixels is formed to extend from the subpixel region into the inter-subpixel region.

Optionally, the counter substrate and the array substrate are assembled so that an orthographic projection of each of the plurality of second electrode blocks on the first base substrate substantially covers an orthographic projection of the organic light emitting layer in one of the plurality of subpixels on the first base substrate.

In some embodiments, the step of forming the spacer layer includes forming a plurality of spacer blocks. Optionally, each of the plurality of first electrode blocks is formed on a side of one of the plurality of spacer blocks distal to the second base substrate in the inter-subpixel region. Optionally, each of the plurality of subpixels is formed to include at least one of the plurality of the spacer blocks.

In some embodiments, the step of forming the counter substrate further includes forming a fourth electrode layer in the inter-subpixel region. Optionally, the fourth electrode layer is formed to include a plurality of fourth electrode blocks. Optionally, each of the plurality of fourth electrode blocks is formed on a side of one of the plurality of spacer blocks proximal to the second base substrate. Optionally, each of the plurality of fourth electrode blocks is formed to be electrically connected to the third electrode layer. Optionally, the fourth electrode layer is made of a metallic material. Optionally, the fourth electrode layer and the spacer layer are formed so that an orthographic projection of each of the plurality of fourth electrode blocks on the second base substrate substantially covers an orthographic projection of one of the plurality of spacer blocks on the second base substrate. Optionally, the fourth electrode layer is formed on a side of the third electrode layer distal to the second base substrate. Optionally, the fourth electrode layer is formed on a side of the third electrode layer proximal to the second base substrate.

In some embodiments, the step of forming the counter substrate further includes forming an insulating layer in the inter-subpixel region and between the spacer layer and the fourth electrode layer. Optionally, the insulating layer is formed to include a plurality of insulating blocks, each of which is formed on a side of one of the plurality of fourth electrode blocks distal to the second base substrate.

In some embodiments, the step of forming the counter substrate further includes forming a recess defined by one of the plurality of insulating blocks, one of the plurality of fourth electrode blocks, and the third electrode layer. The recess is formed so that an orthographic projection of the one of the plurality of insulating blocks on the second base substrate substantially covers a combination of an orthographic projection of the recess on the second base substrate and an orthographic projection of one of the plurality of fourth electrode blocks adjacent to the recess on the second base substrate.

In some embodiments, the organic light emitting layer is formed to extend into the inter-subpixel region and between the spacer layer and the first electrode layer.

In some embodiments, the step of forming the counter substrate further includes forming a black matrix on the second base substrate and in the inter-subpixel region; forming a color filter on the second base substrate and in the subpixel region; and forming an overcoat layer on a side of the black matrix and the color filter distal to the second base substrate. Optionally, the third electrode layer is formed on a side of the overcoat layer distal to the second base substrate.

Figure 8A:
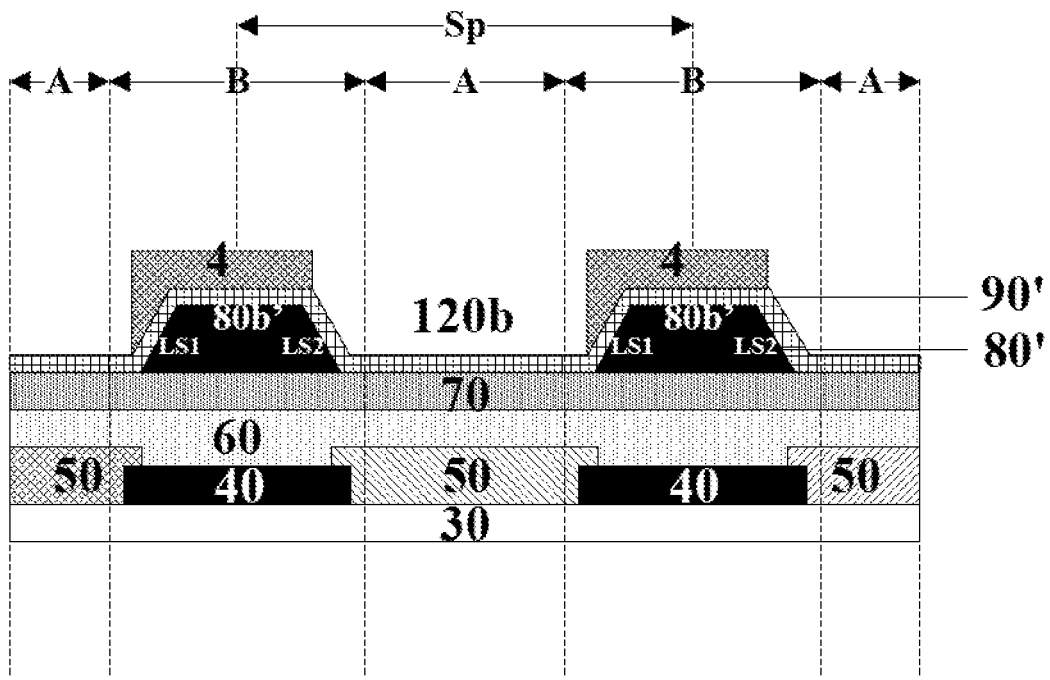
FIGS. 8A to 8F illustrate a process of fabricating an organic light emitting diode display panel in some embodiments according to the present disclosure.

FIGS. 8A to 8F illustrate a process of fabricating an organic light emitting diode display panel in some embodiments according to the present disclosure. Referring to FIG. 8A, a black matrix 40 is formed on a second base substrate 30 and in the inter-subpixel region B; a color filter 50 is formed on the second base substrate 30 and in the subpixel region A; an overcoat layer 60 is formed on a side of the black matrix 40 and the color filter 50 distal to the second base substrate 30; and a third electrode layer 70 is formed on a side of the overcoat layer 60 distal to the second base substrate 30. An electrode material layer 80' is formed on a side of the third electrode layer 70 distal to the overcoat layer 60. The electrode material layer 80' is formed to include a plurality of electrode material blocks 80b' each of which is formed in the inter-subpixel region B. An insulating material layer 90' is formed on a side of the electrode material layer 80' distal to the third electrode layer 70. A photoresist layer 4 is formed on a side of the insulating material layer 90' distal to the electrode material layer 80'. Each of the plurality of electrode material blocks 80b' has a first lateral side LS1 and a second lateral side LS2 opposite to the first lateral side LSL. The photoresist layer 4 is formed so that an orthographic projection of the photoresist layer 4 on the second base substrate 30 substantially covers an orthographic projection of the first lateral side LS1 on the second base substrate 30, but at least partially non-overlapping with an orthographic projection of the second lateral side LS2 on the second base substrate 30. Optionally, the orthographic projection of the photoresist layer 4 on the second base substrate 30 is substantially non-overlapping with an orthographic projection of the second lateral side LS2 on the second base substrate 30.

Figure 8B:
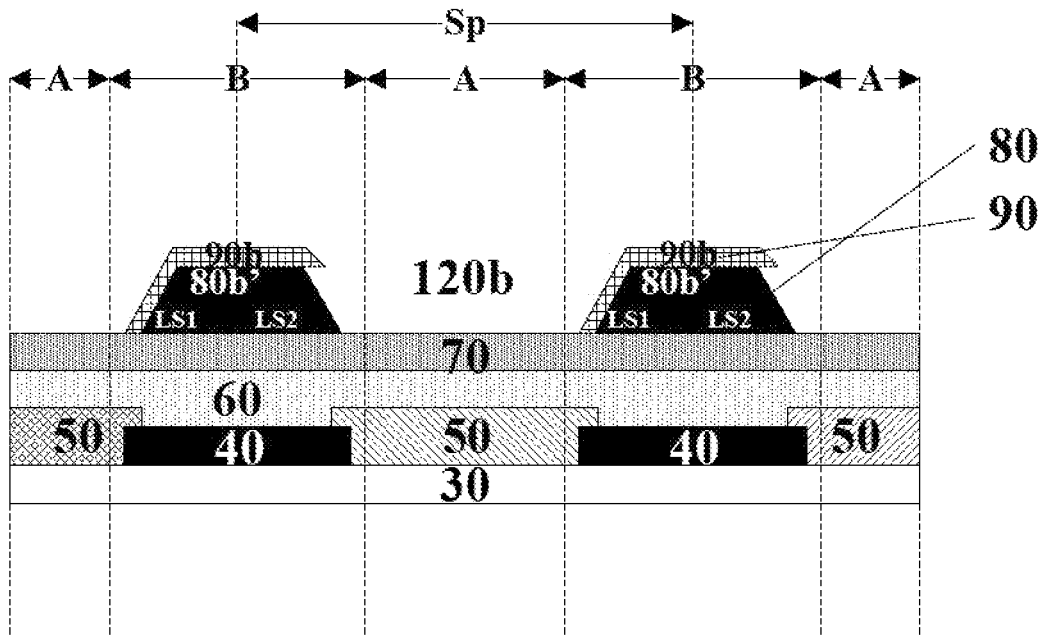

Referring to FIG. 8B, the insulating material layer 90' is patterned to form a plurality of insulating blocks 90b, each of which is formed in the inter-subpixel region B, thereby forming an insulating layer 90. For example, the insulating material layer 90' in the subpixel region A is substantially removed using the photoresist layer 4 as a mask. Each of the plurality of insulating blocks 90b is formed to cover the first lateral side LS1 of one of the plurality of electrode material blocks 80b', but at least partially not cover the second lateral side LS2. Optionally, the second lateral side LS2 is substantially exposed.

Figure 8C:
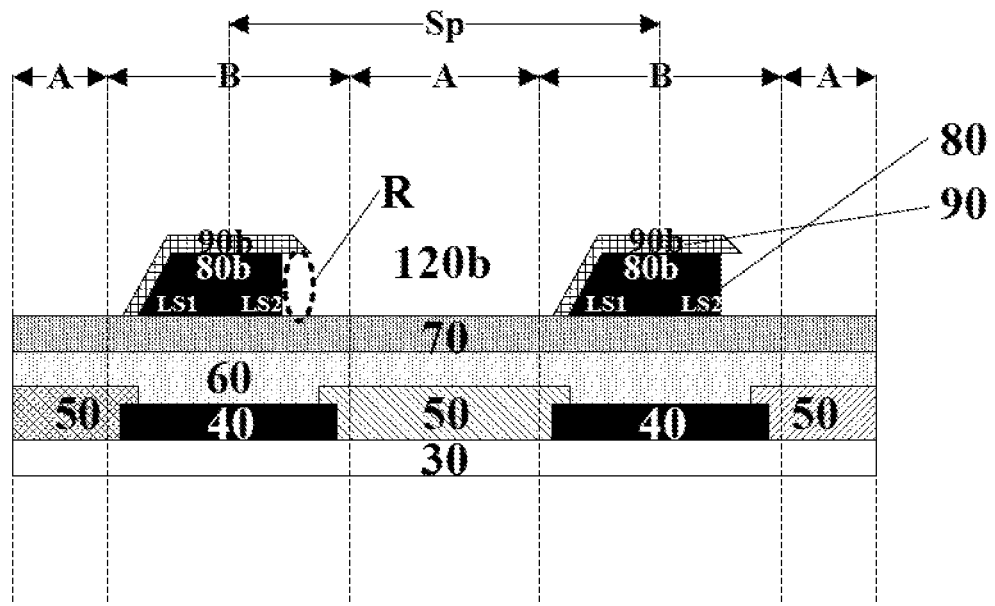

Referring to FIG. 8C, the electrode material layer 80' is over-etched using an etchant, e.g., a wet etchant, thereby forming the fourth electrode layer 80 having a plurality of fourth electrode blocks 80b. Because the second lateral side LS2 of each of the plurality of electrode material blocks 80b' is at least partially exposed, the electrode material layer 80' is over-etch on the second lateral side LS2. Because the first lateral side LS1 of each of the plurality of electrode material blocks 80b' is substantially covered by one of the plurality of insulating blocks 90b, the electrode material layer 80' is substantially not over-etched on the first lateral side LS1. Over-etching of the electrode material layer 80' results in a recess R defined by one of the plurality of insulating blocks 90b, one of the plurality of fourth electrode blocks 80b, and the third electrode layer 70. For example, the recess R is defined by a side surface of the one of the plurality of fourth electrode blocks 80b, a surface of the third electrode layer 70 closest to the insulating layer, and a surface of the one of the plurality of insulating blocks 90b closest to the third electrode layer 70. Optionally, an orthographic projection of the one of the plurality of insulating blocks 90b on the second base substrate 30 substantially covers a combination of an orthographic projection of the recess R on the second base substrate 30 and an orthographic projection of one of the plurality of fourth electrode blocks 80b adjacent to the recess R on the second base substrate 30.

Figure 8D:
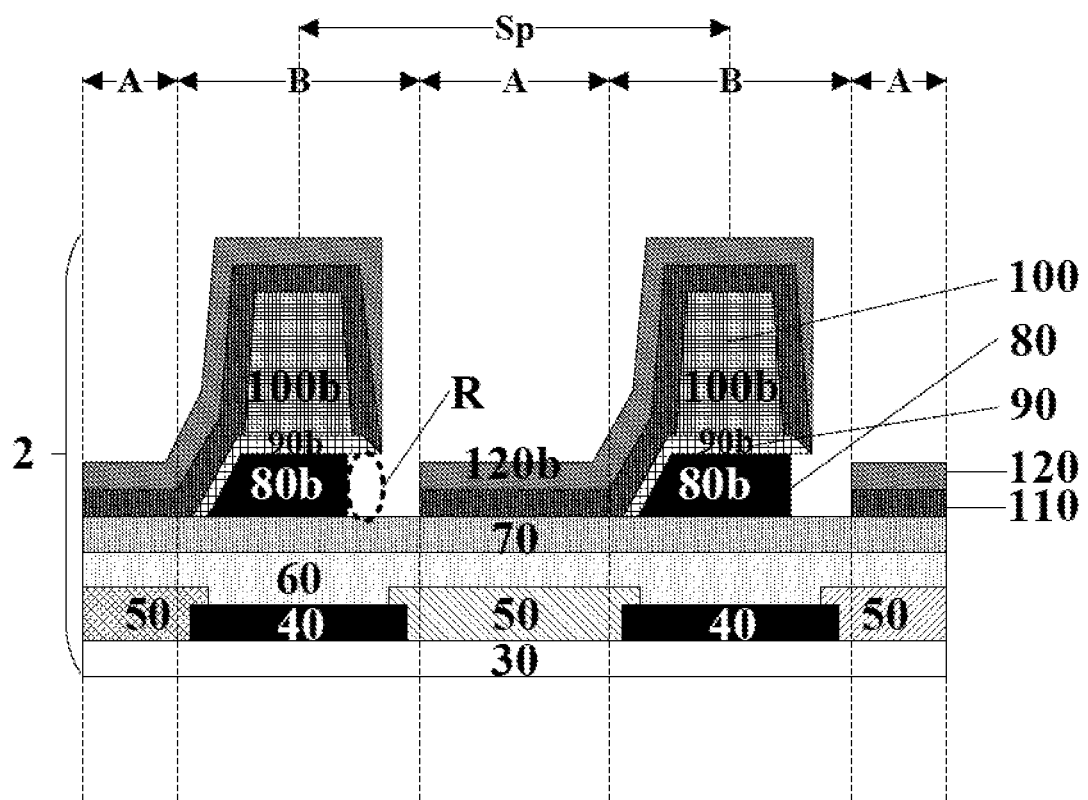

Referring to FIG. 8D, a spacer layer 100 is formed in the inter-subpixel region B and on a side of the insulating layer 90 distal to the fourth electrode layer 80. The spacer layer 100 is formed to include a plurality of spacer blocks 100b. Each of the plurality of spacer blocks 100b is formed on a side of one of the plurality of fourth electrode blocks 80b distal to the third electrode layer 70. Optionally, the spacer layer 100 and the fourth electrode layer 80 are formed so that an orthographic projection of each of the plurality of fourth electrode blocks 80b on the second base substrate 30 substantially covers an orthographic projection of one of the plurality of spacer blocks 100b on the second base substrate 30.

Referring to FIG. 8D, an organic light emitting layer 110 is then formed. The organic light emitting layer 110 in some embodiments is formed in both the subpixel region A and in the inter-subpixel region B. In the inter-subpixel region B, the organic light emitting layer 110 is formed on a side of the spacer layer 100 distal to one of the plurality of insulating blocks 90b. In the subpixel region A, the organic light emitting layer 110 is formed on a side of the third electrode layer 70 distal to the overcoat layer 60. By having a recess R recessing into the one of the plurality of fourth electrode blocks 80b, the organic light emitting layer 110 can be formed so that the one of the plurality of fourth electrode blocks 80b is insulated from an adjacent organic light emitting diode of the plurality of organic light emitting diodes OLED in an adjacent subpixel of the plurality of subpixels Sp. For example, by having the recess R, the organic light emitting layer 110 can be formed so that the one of the plurality of fourth electrode blocks 80b is insulated from the organic light emitting layer 110 in an adjacent subpixel of the plurality of subpixels Sp.

Referring to FIG. 8D, a first electrode layer 120 is formed. The first electrode layer 120 in some embodiments is formed in both the subpixel region A and in the inter-subpixel region B. In the inter-subpixel region B, the first electrode layer 120 is formed on a side of the organic light emitting layer 110 distal to one of the plurality of the spacer blocks 100b. In the subpixel region A, the first electrode layer 120 is formed on a side of the organic light emitting layer 110 distal to the third electrode layer 70. By having a recess R recessing into the one of the plurality of fourth electrode blocks 80b, the first electrode layer 120 can be formed so that the one of the plurality of fourth electrode blocks 80b is insulated from the first electrode layer 120 in an adjacent subpixel of the plurality of subpixels Sp. As shown in FIG. 8D, the first electrode layer 120 in some embodiments is formed to include a plurality of first electrode blocks 120b. A counter substrate 2 is then formed.

Figure 8E:
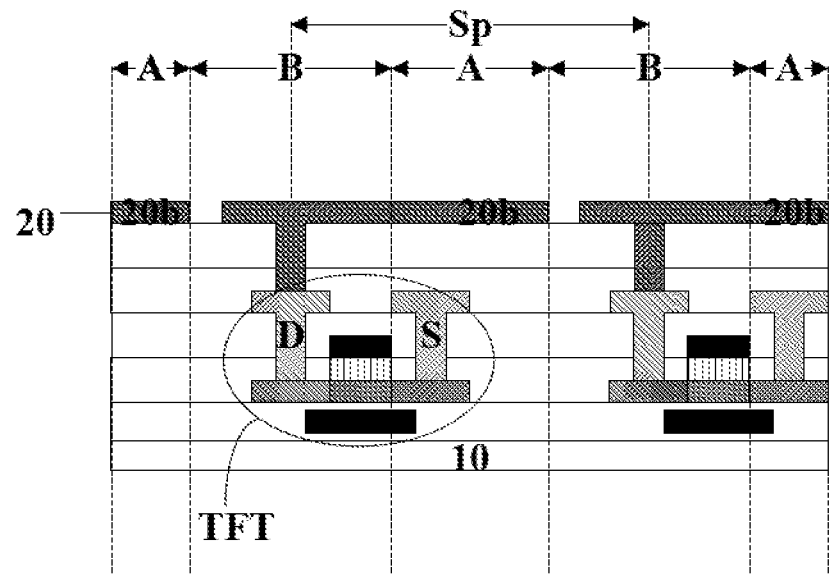

Referring to FIG. 8E, an array substrate 1 is provided. The array substrate 1 is formed to includes a first base substrate 10, a plurality of thin film transistors TFT on the first base substrate 10, and a second electrode layer 20 on a side of the plurality of thin film transistors TFT distal to the first base substrate 10. The second electrode layer 20 is formed to include a plurality of second electrode blocks 20b, each of which being electrically connected to a drain electrode D of one of the plurality of thin film transistors TFT.

Figure 8F:
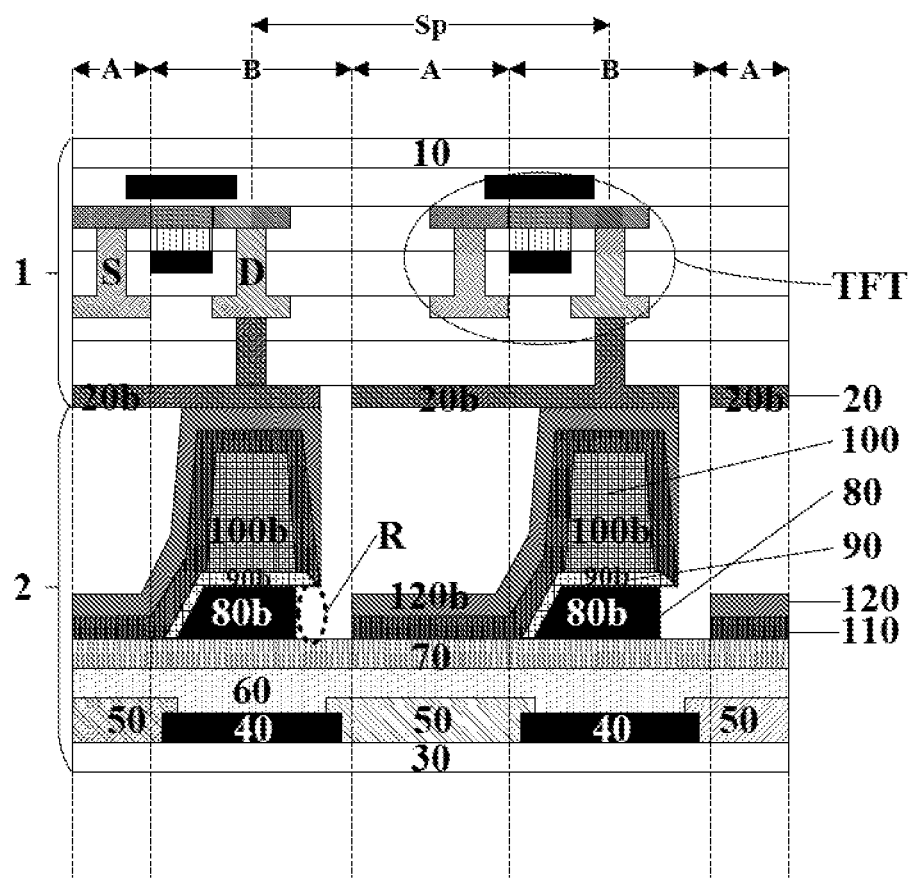

Referring to FIG. 8F, the array substrate 1 and the counter substrate 2 are assembled together to form an organic light emitting diode display panel. The array substrate 1 and the counter substrate 2 are assembled together in a way so that the plurality of first electrode blocks 120b and the plurality of second electrode blocks 20b are substantially aligned. For example, the array substrate 1 and the counter substrate 2 are assembled together so that each of the plurality of first electrode blocks 120b is electrically connected to one of the plurality of second electrode blocks 20b in the array substrate 1, and in turn electrically connected to the drain electrode D of one of the plurality of thin film transistors TFT. In another example, the array substrate 1 and the counter substrate 2 are assembled together so that each of the plurality of first electrode blocks 120b is in direct contact with (e.g., without any intervening layer or structure) one of the plurality of second electrode blocks 20b in the array substrate 1.

In another aspect, the present disclosure provides an organic light emitting diode display apparatus having an organic light emitting diode display panel described herein or fabricated by a method described herein. Examples of appropriate display apparatuses include, but are not limited to, an electronic paper, a mobile phone, a tablet computer, a television, a monitor, a notebook computer, a digital album, a GPS, etc. In one example, the display apparatus is a smart watch.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An organic light emitting diode display panel having a plurality of subpixels, comprising:
   an array substrate; and
   a counter substrate facing the array substrate;
   wherein the counter substrate comprises a plurality of organic light emitting diodes; and
   the array substrate comprises a first base substrate and a plurality of thin film transistors on the first base substrate for driving light emission of the plurality of organic light emitting diodes in the counter substrate;
   wherein the counter substrate has a subpixel region and an inter-subpixel region;
   wherein the counter substrate in the inter-subpixel region comprises:
   a second base substrate;
   a spacer layer on the second base substrate configured to maintain a spacing between the array substrate and the counter substrate; and
   a first electrode layer on a side of the spacer layer distal to the second base substrate, and electrically connected to the plurality of the thin film transistors in the array substrate;
   wherein the array substrate further comprises a second electrode layer on a side of the plurality of the thin film transistors distal to the first base substrate;
   the second electrode layer comprises a plurality of second electrode blocks, each of which being electrically connected to a drain electrode of one of the plurality of thin film transistors; and
   the first electrode layer in the counter substrate comprises a plurality of first electrode blocks, each of which being electrically connected to one of the plurality of second electrode blocks in the array substrate;
   wherein the counter substrate in the subpixel region comprises:
   a third electrode layer on the second base substrate; and
   an organic light emitting layer on a side of the third electrode layer distal to the second base substrate; wherein the first electrode layer is on a side of the organic light emitting layer distal to the third electrode layer; and
   each of the plurality of first electrode blocks in each of the plurality of subpixels extends from the subpixel region into the inter-subpixel region;
   wherein the spacer layer comprises a plurality of spacer blocks; and
   each of the plurality of first electrode blocks is on a side of one of the plurality of spacer blocks distal to the second base substrate in the inter-subpixel region;
   wherein the counter substrate in the inter-subpixel region further comprises a fourth electrode layer;

the fourth electrode layer comprises a plurality of fourth electrode blocks;
each of the plurality of fourth electrode blocks is on a side of one of the plurality of spacer blocks proximal to the second base substrate; and
each of the plurality of fourth electrode blocks is electrically connected to the third electrode layer;
wherein the counter substrate in the inter-subpixel region further comprises an insulating layer between the spacer layer and the fourth electrode layer; and
the insulating layer comprises a plurality of insulating blocks, each of which is on a side of one of the plurality of fourth electrode blocks distal to the second base substrate;
wherein the organic light emitting diode display panel comprises a recess defined by one of the plurality of insulating blocks, one of the plurality of fourth electrode blocks, and the third electrode layer; and
an orthographic projection of the one of the plurality of insulating blocks on the second base substrate substantially covers a combination of an orthographic projection of the recess on the second base substrate and an orthographic projection of one of the plurality of fourth electrode blocks adjacent to the recess on the second base substrate.

2. The organic light emitting diode display panel of claim 1, wherein the first electrode layer is a substantially transparent electrode layer.

3. The organic light emitting diode display panel of claim 1, wherein the second electrode layer is a reflective electrode layer, and the plurality of second electrode blocks are a plurality of reflective electrode blocks.

4. The organic light emitting diode display panel of claim 1, wherein an orthographic projection of each of the plurality of second electrode blocks on the first base substrate substantially covers an orthographic projection of the organic light emitting layer in one of the plurality of subpixels on the first base substrate.

5. The organic light emitting diode display panel of claim 1, wherein each of the plurality of subpixels comprises at least one of the plurality of the spacer blocks.

6. The organic light emitting diode display panel of claim 1, wherein the fourth electrode layer comprises a metallic material.

7. The organic light emitting diode display panel of claim 1, wherein an orthographic projection of each of the plurality of fourth electrode blocks on the second base substrate substantially covers an orthographic projection of one of the plurality of spacer blocks on the second base substrate.

8. The organic light emitting diode display panel of claim 1, wherein the fourth electrode layer is on a side of the third electrode layer distal to the second base substrate.

9. The organic light emitting diode display panel of claim 1, wherein the counter substrate in the inter-subpixel region further comprises an organic light emitting layer between the spacer layer and the first electrode layer; and
the organic light emitting layer in each of the plurality of subpixels extends from the subpixel region into the inter-subpixel region.

10. The organic light emitting diode display panel of claim 1, wherein the counter substrate further comprises:
a black matrix on the second base substrate and in the inter-subpixel region;
a color filter on the second base substrate and in the subpixel region; and
an overcoat layer on a side of the black matrix and the color filter distal to the second base substrate.

11. The organic light emitting diode display panel of claim 1, wherein the array substrate is absent of a pixel definition layer.

12. A method of fabricating an organic light emitting diode display panel having a subpixel region and an inter-subpixel region, and a plurality of subpixels, comprising:
forming a counter substrate;
forming an array substrate; and
assembling the counter substrate and the array substrate together;
wherein forming the counter substrate comprises forming a plurality of organic light emitting diodes; and
forming the array substrate comprises forming a plurality of thin film transistors on a first base substrate for driving light emission of the plurality of organic light emitting diodes in the counter substrate;
wherein the counter substrate has a subpixel region and an inter-subpixel region;
wherein the counter substrate in the inter-subpixel region comprises:
a second base substrate;
a spacer layer on the second base substrate configured to maintain a spacing between the array substrate and the counter substrate; and
a first electrode layer on a side of the spacer layer distal to the second base substrate, and electrically connected to the plurality of the thin film transistors in the array substrate;
wherein the array substrate further comprises a second electrode layer on a side of the plurality of the thin film transistors distal to the first base substrate;
the second electrode layer comprises a plurality of second electrode blocks, each of which being electrically connected to a drain electrode of one of the plurality of thin film transistors; and
the first electrode layer in the counter substrate comprises a plurality of first electrode blocks, each of which being electrically connected to one of the plurality of second electrode blocks in the array substrate;
wherein the counter substrate in the subpixel region comprises:
a third electrode layer on the second base substrate; and
an organic light emitting layer on a side of the third electrode layer distal to the second base substrate;
wherein the first electrode layer is on a side of the organic light emitting layer distal to the third electrode layer; and
each of the plurality of first electrode blocks in each of the plurality of subpixels extends from the subpixel region into the inter-subpixel region;
wherein the spacer layer comprises a plurality of spacer blocks; and
each of the plurality of first electrode blocks is on a side of one of the plurality of spacer blocks distal to the second base substrate in the inter-subpixel region;
wherein the counter substrate in the inter-subpixel region further comprises a fourth electrode layer;
the fourth electrode layer comprises a plurality of fourth electrode blocks;
each of the plurality of fourth electrode blocks is on a side of one of the plurality of spacer blocks proximal to the second base substrate; and
each of the plurality of fourth electrode blocks is electrically connected to the third electrode layer;
wherein the counter substrate in the inter-subpixel region further comprises an insulating layer between the spacer layer and the fourth electrode layer; and the insulating layer comprises a plurality of insulating blocks, each of which is on a side of one of the plurality of fourth electrode blocks distal to the second base substrate;

wherein the organic light emitting diode display panel comprises a recess defined by one of the plurality of insulating blocks, one of the plurality of fourth electrode blocks, and the third electrode layer; and an orthographic projection of the one of the plurality of insulating blocks on the second base substrate substantially covers a combination of an orthographic projection of the recess on the second base substrate and an orthographic projection of one of the plurality of fourth electrode blocks adjacent to the recess on the second base substrate.

* * * * *